United States Patent
Huang et al.

(10) Patent No.: US 9,728,670 B2
(45) Date of Patent: Aug. 8, 2017

(54) LIGHT-EMITTING DIODE AND MANUFACTURING METHOD THEREFOR

(71) Applicant: Xiamen Sanan Optoelectronics Technology Co., Ltd., Xiamen (CN)

(72) Inventors: Shaohua Huang, Xiamen (CN); Jyh-Chiarng Wu, Xiamen (CN)

(73) Assignee: Xiamen Sanan Optoelectronics Technology Co., Ltd., Xiamen (CN)

( * ) Notice: Subject to any disclaimer, the term of this patent is extended or adjusted under 35 U.S.C. 154(b) by 285 days.

(21) Appl. No.: 14/395,631

(22) PCT Filed: Mar. 19, 2013

(86) PCT No.: PCT/CN2013/072861
§ 371 (c)(1),
(2) Date: Oct. 20, 2014

(87) PCT Pub. No.: WO2013/159614
PCT Pub. Date: Oct. 31, 2013

(65) Prior Publication Data
US 2015/0084088 A1   Mar. 26, 2015

(30) Foreign Application Priority Data
Apr. 23, 2012 (CN) .......................... 2012 1 0119410

(51) Int. Cl.
*H01L 33/00* (2010.01)
*H01L 33/02* (2010.01)
(Continued)

(52) U.S. Cl.
CPC .......... *H01L 33/002* (2013.01); *H01L 33/025* (2013.01); *H01L 33/12* (2013.01); *H01L 33/0079* (2013.01); *H01L 33/14* (2013.01)

(58) Field of Classification Search
CPC .................................. H01L 33/14; H01L 33/22
See application file for complete search history.

(56) References Cited

U.S. PATENT DOCUMENTS

| | | | |
|---|---|---|---|
| 6,163,037 A | 12/2000 | Matsumoto et al. | |
| 2007/0057273 A1* | 3/2007 | Yoo | H01L 33/0079 257/99 |
| 2012/0280258 A1* | 11/2012 | Yeh | H01L 33/007 257/88 |

FOREIGN PATENT DOCUMENTS

| | | |
|---|---|---|
| CN | 101878545 | 11/2010 |
| CN | 102629652 | 8/2012 |

OTHER PUBLICATIONS

International Search Report for International Application No. PCT/CN2013072861 "Light-Emitting Diode and Manufacturing Method Therefor," Date of Mailing: Jun. 13, 2013.

* cited by examiner

*Primary Examiner* — Samuel Gebremariam
(74) *Attorney, Agent, or Firm* — Syncoda LLC; Feng Ma; Junjie Feng

(57) ABSTRACT

Disclosed is a light-emitting diode with an n-type graded buffer layer and a manufacturing method therefor. An epitaxial structure of a light-emitting diode comprises: a growth substrate; an n-type graded buffer layer located on the growth substrate; an n-type limiting layer (231) located on the n-type graded buffer layer; an active layer (232) located on the n-type limiting layer (231); and a p-type limiting layer (233) located on the active layer (232). A buffer layer is converted into an n-type graded buffer layer by means of an ion implantation method, and is applied to a light-emitting diode chip of a vertical structure while ensuring that a high-quality epitaxial structure is obtained, thereby being able to effectively reduce the contact resistance.

13 Claims, 9 Drawing Sheets

(51) Int. Cl.
*H01L 33/12* (2010.01)
*H01L 33/14* (2010.01)

LIGHT-EMITTING DIODE AND MANUFACTURING METHOD THEREFOR

This application is the U.S. National Stage of International Application No. PCT/CN2013/072861, filed on Mar. 19, 2013, published in Chinese, which claims priority to the Chinese Patent Application No. 201210119410.9 filed on Apr. 23, 2012. The entire teachings of the above applications are incorporated herein by reference.

FIELD OF THE INVENTION

The present invention relates to a light emitting diode (LED) and fabrication method therefor, more particularly, to an LED having an n-type gradient buffer layer and fabrication method therefor.

BACKGROUND OF THE INVENTION

In recent years, applications of the GaN-based LEDs have been broadened from such fields as display, indication and key backlight to LCD backlight and illumination, accompanied with an increasingly high luminous efficiency year by year. Since the homoplasmon monocrystal material is rare, the epitaxial growth of the GaN-based material, in general, is made on a heterogeneous substrate. The high-efficient blue and green GaN-based LED growing on sapphire is the most popular technology right now. Moreover, to achieve high-quality epitaxial structure, a u-doped buffer layer is typically inserted between the substrate and the luminous epitaxial layer.

The GaN-based LED chip has two basic structures: lateral and vertical. In the lateral chip, two electrodes are at same side of the chip, easily leading to electrode blockage owning to unequal distances that the lateral current flows in the n-type and p-type cladding layers. In contrast, in the vertical chip, two electrodes are at two sides of the epitaxial layer. The second electrode is the patterned electrode and all p-type cladding layers; therefore, almost all the current vertically flows through the epitaxial layer with rare laterally flowing current, thus improving the current distribution in the plane structure and the luminous efficiency. Moreover, the vertical chip can overcome the shading problem of the p-electrode and increase luminous area of the LED chip.

Referring to FIG. 1 and FIG. 2, the fabrication process of the vertical GaN-based LED chip mainly includes the following steps: growing a u-doped buffer layer and a GaN-based luminous epitaxial layer (sequentially comprising an n-GaN layer, an active layer and a p-GaN layer) on a growth substrate; bonding a conductive supporting substrate on the p-GaN layer, and a p-electrode is stacked on the other face thereof; removing the growth substrate and fabricating an n-electrode. Since the n-electrode contacts the n-GaN layer, it is required to etch the u-doped buffer layer at the bottom to the n-GaN layer through dry etching, which is difficult to control during production. Moreover, the contact resistance is high so that a high component thermal resistance will be derived. When the product is applied in an ultra-high power product, the high thermal resistance may reduce the luminous efficiency and shorten the service life of the component, and further influence the overall performance of the component.

SUMMARY OF THE INVENTION

To solve the above problems of the prior art, the present invention discloses an LED having an n-type gradient buffer layer and fabrication method therefor.

According to a first aspect of this invention, an LED epitaxial structure comprises a growth substrate; an n-type gradient buffer layer on the growth substrate; an n-type cladding layer on the n-type gradient buffer layer; an active layer on the n-type cladding layer; and a p-type cladding layer on the active layer.

According to a second aspect of this invention, an LED epitaxial growth method includes the following steps: 1) providing a growth substrate, on which an u-doped buffer layer is formed via epitaxial growth; 2) changing the buffer layer into an n-type gradient buffer layer through ion implantation; 3) forming an n-type cladding layer via the second epitaxial growth on the n-type gradient buffer layer; 4) forming an active layer on the n-type cladding layer via epitaxial growth; and 5) forming a p-type cladding layer on the active layer via epitaxial growth.

According to a third aspect of this invention, a vertical LED chip comprises: a conductive substrate; a luminous epitaxial layer on the conductive substrate including an n-type cladding layer, a p-type cladding layer and an active layer between the two; an n-type gradient buffer layer formed on the n-type cladding layer; and an n-electrode formed on the n-type buffer layer structure.

According to a fourth aspect of this invention, a fabrication method of the vertical LED chip includes the following steps: 1) providing a growth substrate, on which a u-doped buffer layer is formed via epitaxial growth; 2) changing the buffer layer into an n-type gradient buffer layer through ion implantation; 3) forming an n-type cladding layer, an active layer and a p-type cladding layer via the second epitaxial growth on the n-type gradient buffer layer, thus constituting an LED epitaxial structure; 4) forming a metal reflecting layer on the p-type cladding layer; 5) providing a conductive substrate and bonding it with the epitaxial structure; 6) removing the growth substrate and exposing the surface of the n-type gradient buffer layer; 7) making an n-electrode on the exposed n-type gradient buffer layer; and making a p-electrode on the back of the conductive substrate; and 8) forming a vertical LED chip by cutting.

In this invention, the growth substrate can be a flat surface or a patterned surface. The n-type doping of the n-type gradient buffer layer appears to have a Gaussian distribution with a concentration above $1 \times 10^{18}$. Furthermore, the side close to the growth substrate is highly doped.

Compared with the prior art, this invention has the advantages that: with this invention, the vertical chip can directly contact the electrode to the surface layer after reversal. Moreover, a high-concentration doping can be obtained through ion implantation without impeding the second epitaxial growth, thus greatly improving the component characteristics of the vertical chip.

Other features and advantages of this invention will be described hereafter, which will become obvious partially through the Description or be understood through the implementation of this invention. The object and other advantages of this invention may be achieved and implemented through the structures specifically described in the Description, Claims and Drawings.

Although this invention will be described with reference to some illustrative embodiments and application methods hereafter, those skilled in the art should understand that these embodiments are not intended to limit this invention. On the contrary, all substitutions, modifications and equivalents within the spirit and scope of this invention defined by the appended Claims are intended to be encompassed.

BRIEF DESCRIPTION OF THE DRAWINGS

The drawings are used to further understand this invention and constitute a part of the Description, which is used together with the embodiments herein to describe this invention and does not constitute limitations to this invention. Moreover, the data in the drawings are just a summary and not drawn to scale.

FIGS. 3-10 are the sectional views of the fabrication process of the vertical GaN-based LED chip in Embodiment 1 of this invention; wherein, FIG. 6 is a schematic diagram of the LED epitaxial structure in Embodiment 1 of this invention, and FIG. 10 is a structural diagram of the vertical GaN-based LED chip in Embodiment 1 of this invention.

NUMERALS IN THE FIGURES REPRESENT

110: growth substrate, 120: u-doped buffer; 130: n-GaN layer; 132: MQW active layer; 133: p-GaN layer; 160: conductive substrate; 170: n-electrode; 180: p-electrode; 210, 310: growth substrate, 220, 320: u-doped buffer; 221, 321: n-type gradient buffer layer high doping end; 222, 322: n-type gradient buffer layer low doping end; 223: n-type gradient buffer layer; 231, 331: n-GaN layer; 232, 332: MQW active layer; 233, 333: p-GaN layer; 240, 340: metal reflecting layer; 250, 350: metal bonding layer; 260, 360: conductive substrate; 270, 370: n-electrode; 280, 380: p-electrode.

SPECIFIC EMBODIMENTS

Now, the embodiments of the present invention are described in detail below with reference to the drawings and examples to ensure that the application of technical means of the present invention to solve technical problems and the process for achieving the technical effects can be fully understood and implemented accordingly. It should be noted that as long as there is no conflict, all examples of the present invention and all features in all examples can be combined with each other, and the consultant technical solutions are all encompassed by the present invention.

Embodiment 1

Figure 1:
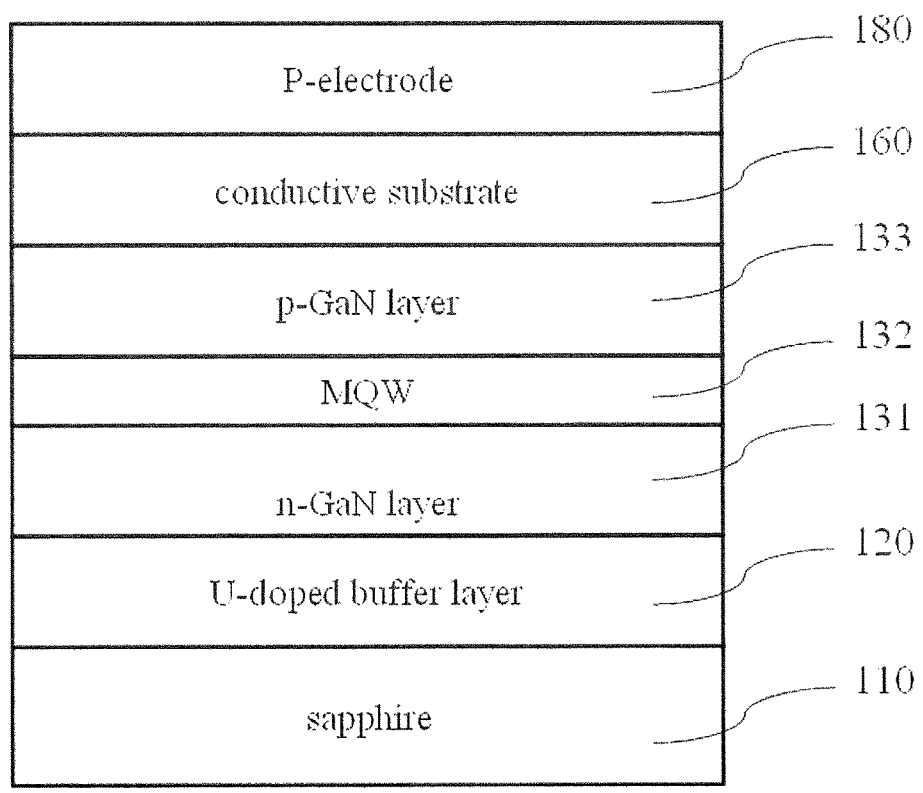
FIGS. 1-2 are sectional views of the fabrication process of the traditional vertical GaN-based LED chip.
Figure 2:
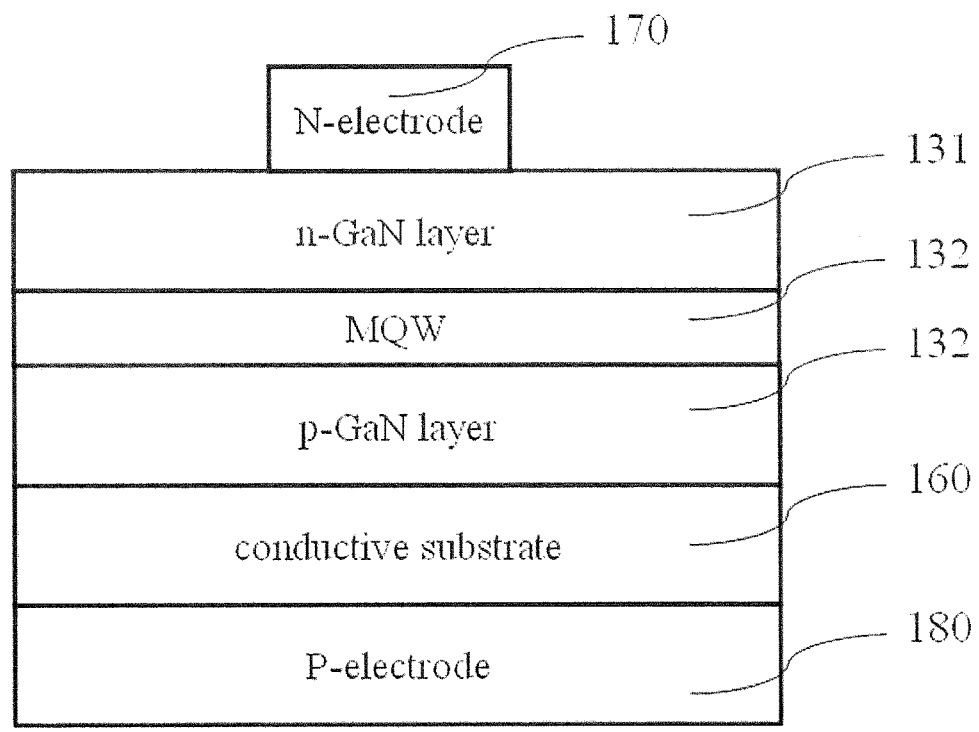
Figure 3:
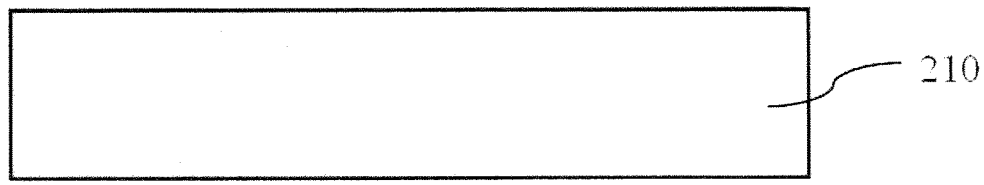

Now, detailed description is given to the first preferred embodiment of this invention with reference to FIGS. 3~10. An LED fabrication process includes the following steps:

Referring to FIG. 3, firstly, provide a growth substrate 210 with a flat surface. A sapphire is suitable for this growth substrate.

Figure 4:
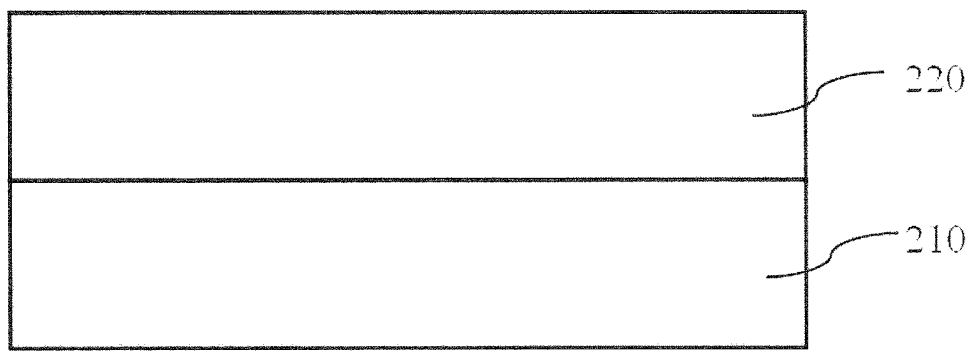

Referring to FIG. 4, form an u-doped buffer layer 220 on the growth substrate 210 thicker than 100 Å (200 Å is suitable).

Figure 5:
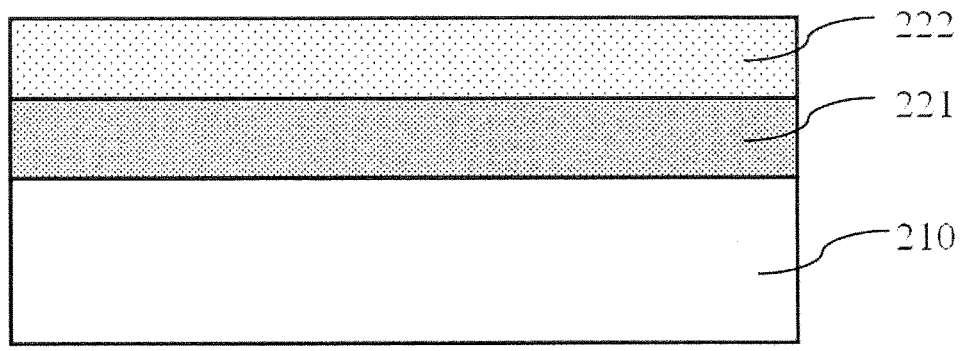
Figure 14:
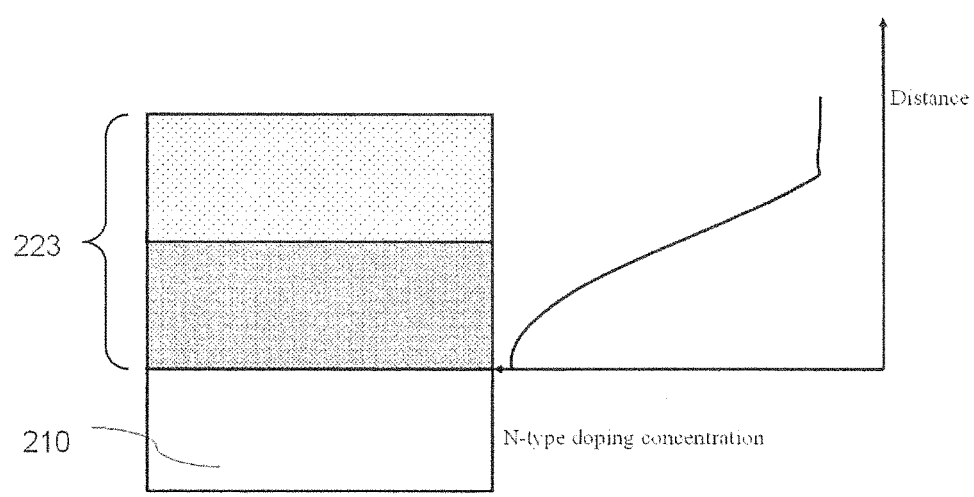
FIG. 14 is a distribution diagram of n-type doping in the n-type gradient buffer layer of this invention.

Referring to FIG. 5, inject the Si ion into the u-doped buffer layer 220 via ion implantation to form n-type gradient buffer layers 221 and 222, wherein the Si ion appears to have a Gaussian distribution and the concentration of 221 is greater than that of 222. See FIG. 14 for the Si doping concentration distribution, and the gradient range of the doping concentration is $1\times10^{18}\sim1\times10^{20}$. The doping concentration of 221 that is close to the growth substrate ranges from $5\times10^{18}$ to $1\times10^{20}$, and the concentration of 222 that is far from the growth substrate ranges from $1\times10^{18}$ to $5\times10^{18}$.

In this embodiment, the concentration of the n-type doping buffer layer gradually changes from $1\times10^{19}$ to $5\times10^{18}$.

Figure 6:
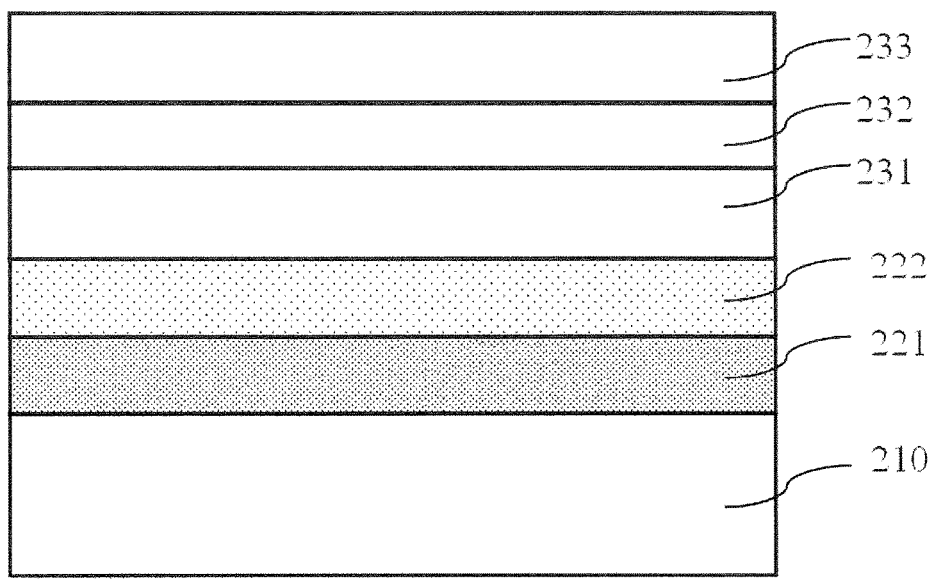

Referring to FIG. 6, make a second epitaxial growth on the n-type gradient buffer layer 223, sequentially including an n-GaN layer 231, an MQW active layer 232 and a p-GaN layer 233 to complete the growth process of the epitaxial wafer.

Figure 7:
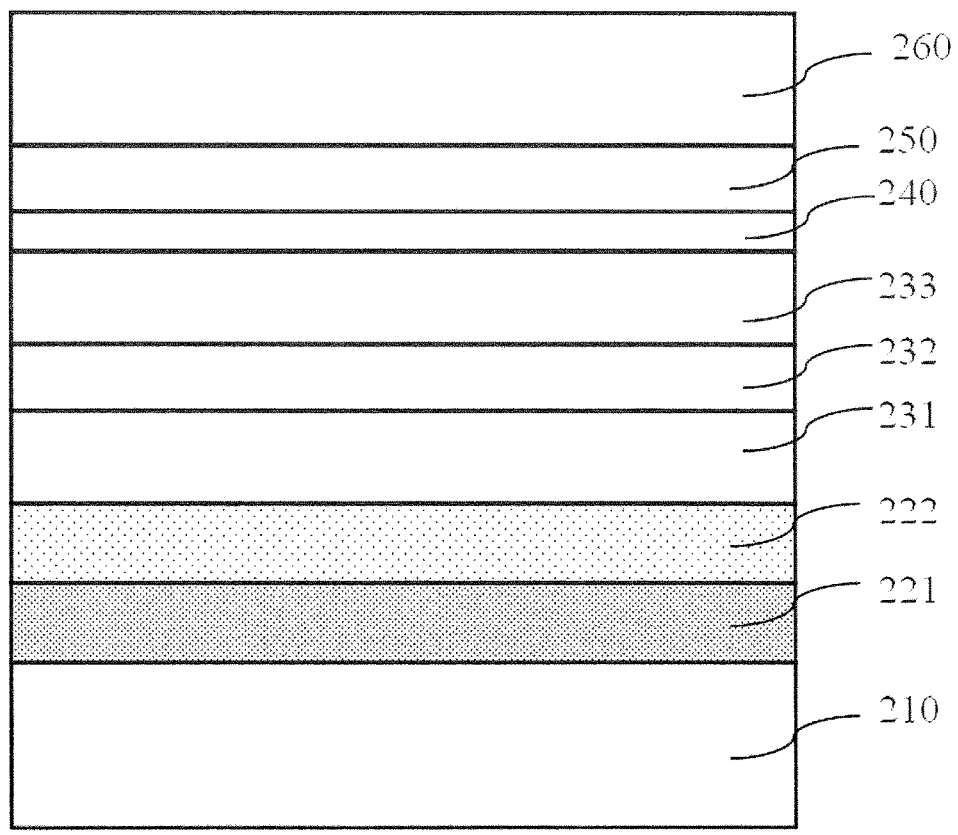

Referring to FIG. 7, evaporate a metal reflecting layer 240 on the p-GaN layer 233 and provide a conductive substrate 260 (e.g. Si wafer). Form a metal bonding layer 250 on the conductive substrate 260 and the metal reflecting layer 240, respectively, and bond the epitaxial wafer with the conductive substrate 260 with the high-pressure heating method. The metal reflecting layer 240 is a NiO/Ag combination, wherein the thickness of NiO is less than 10 Å; and the metal bonding layer 250 can be one selected from Au, AuSn, AgSnCu, SnAu and SnCu or a combination thereof.

Figure 8:
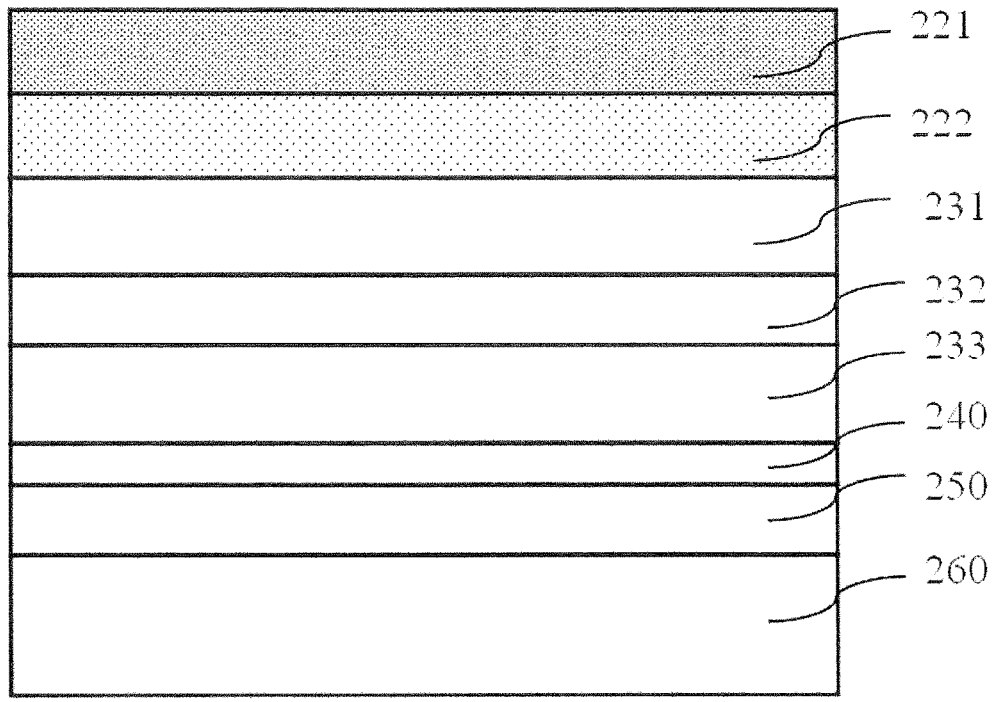

Referring to FIG. 8, remove the growth substrate 210 either by LLO or grinding for thinning.

Figure 9:
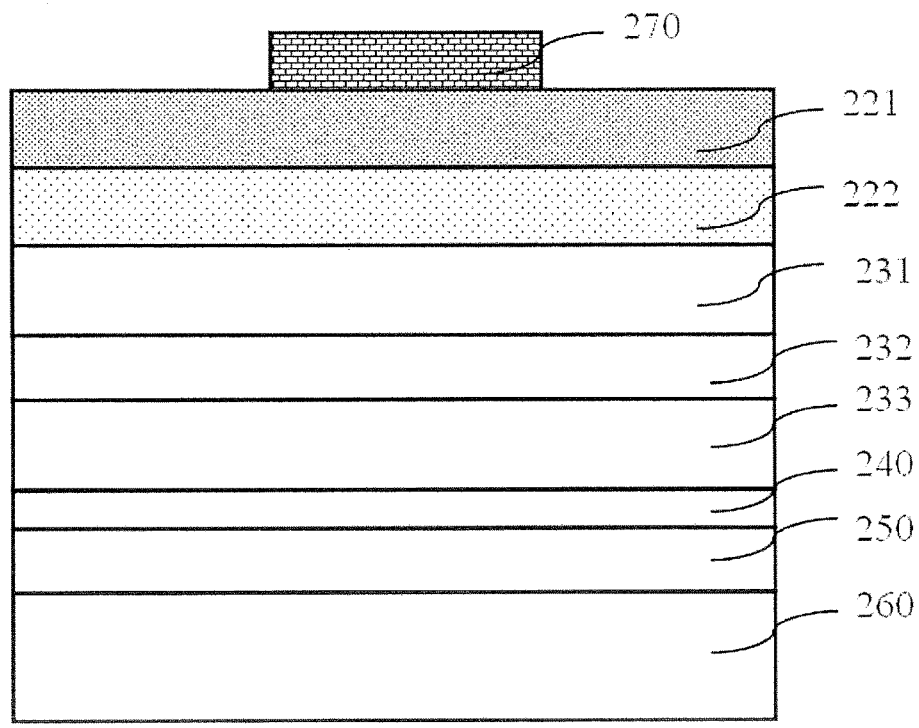

Referring to FIG. 9, make an n-electrode 270 on the n-type gradient buffer layer 223.

Figure 10:
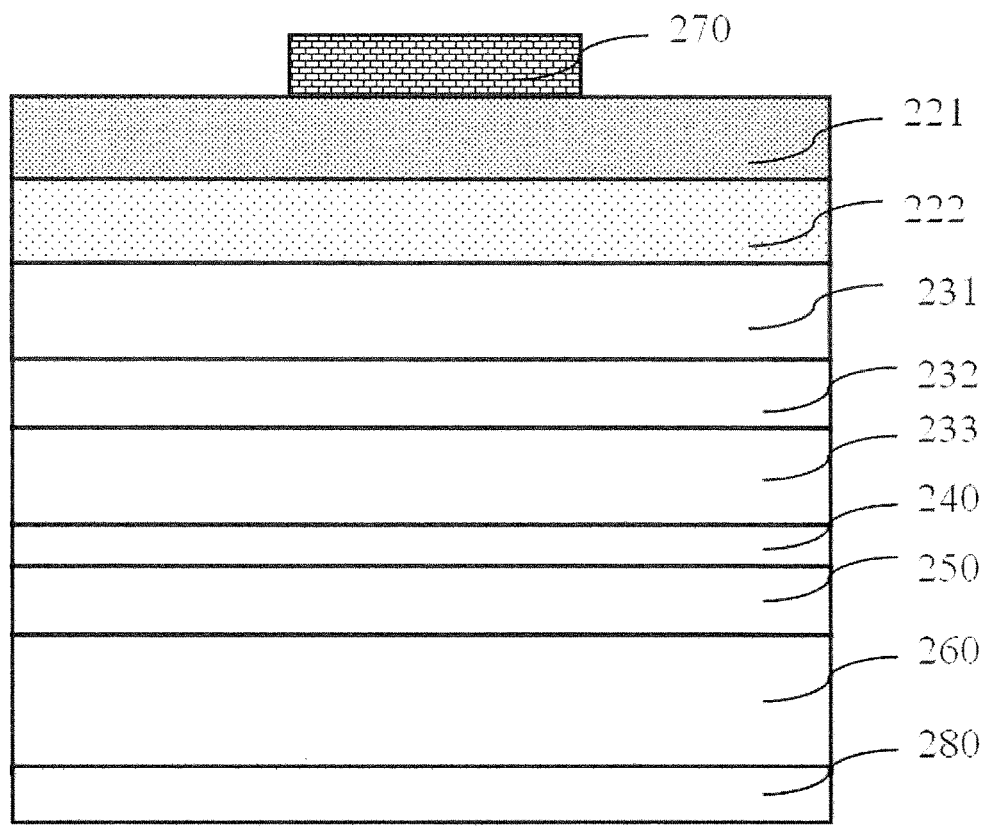

Referring to FIG. 10, make a p-electrode on the back of the conductive substrate 260 and cut it into a vertical LED chip.

In this embodiment, firstly, grow an u-doped buffer layer on the growth substrate. Transfer the buffer layer into an n-type gradient structure with doping in Gaussian distribution and make the end close to the n-GaN cladding layer into low doping. Make a second epitaxial growth on the low-doping end 232 to ensure the lattice quality of the luminous epitaxial structure; the end 221 that is close to the growth substrate is of high doping and relatively low resistance; in the subsequent fabrication process of the vertical chip, directly make the electrode after direct removal of the growth substrate rather than etching the u-doped buffer layer in traditional process, thus eliminating the high thermal resistance.

Embodiment 2

Figure 11:
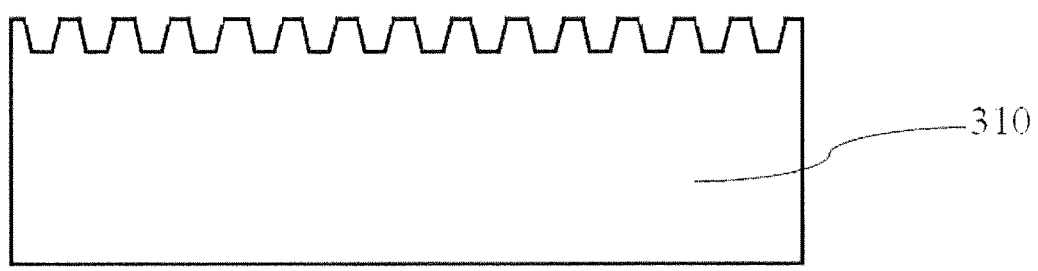
FIGS. 11-13 are sectional views of the fabrication method of the vertical GaN-based LED chip in Embodiment 2 of this invention.
Figure 12:
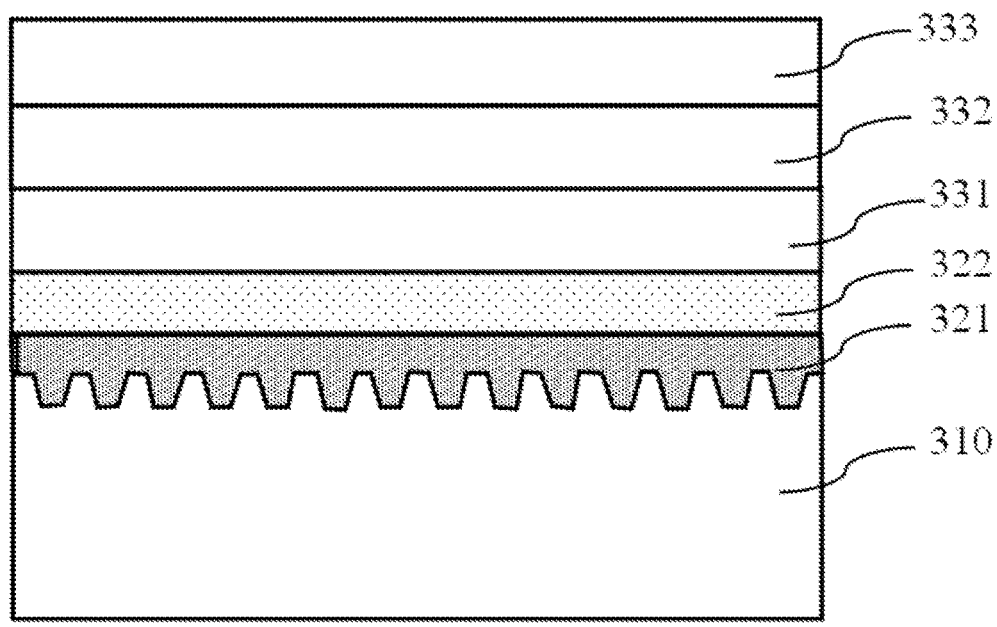
Figure 13:
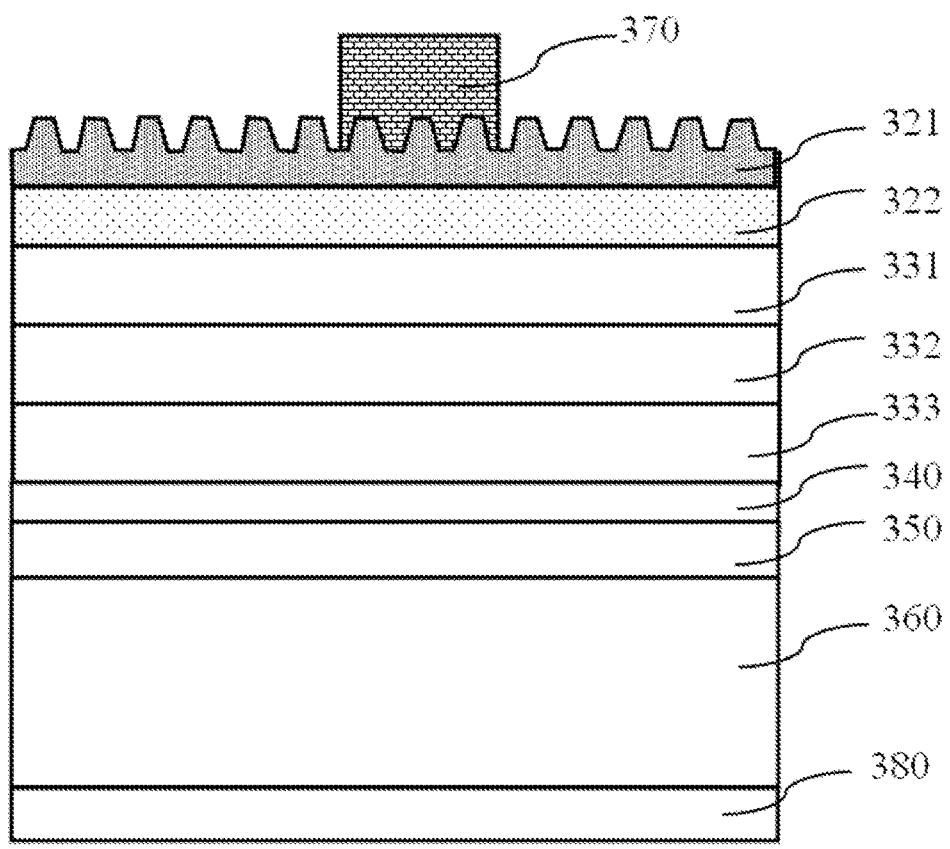

Referring to FIGS. 11-13, the difference between this embodiment and Embodiment 1 is that: this embodiment adopts a patterned growth substrate 310, as shown in FIG. 11, i.e., the surface of the growth substrate 310 has regular and rolling patterns.

Referring to FIG. 12, form undulating n-type gradient buffer layers 321 and 322 sequentially on the patterned growth substrate 310, wherein the concentration of the n-type gradient buffer layer 221 is higher than that of 222. An n-GaN layer 331 is on the n-type gradient buffer layer 322; an active layer 332 is formed on the n-GaN layer 331 and a p-GaN layer 333 is formed on the active layer 332. Refer to Embodiment 1 for the n-type doping concentration of the gradient buffer layer.

Referring to FIG. 13, form a metal reflecting layer 340 on the p-GaN layer 333; form a metal bonding layer 350 on the metal reflecting layer 340 and the conductive substrate 360, respectively. Bond the epitaxial structure (as shown in FIG. 12) with the conductive substrate 360 with the high pressure heating method. Remove the growth substrate 310. Make an n-electrode 370 on the undulating patterned n-type gradient buffer layer 321 and make a p-electrode 380 on the back of the conductive substrate 7.

On the basis of Embodiment 1, this embodiment adopts a patterned growth substrate, which, on the one hand, effectively improves the quality of the epitaxial structure during the epitaxial growth of the buffer layer, and on the other hand, transfers the pattern on the growth substrate to the n-type gradient buffer layer. After fabrication of the vertical chip, the n-type gradient buffer layer is taken as the light emitting surface of the component, which behaves as a light guide to reduce total reflection and improve the light emitting effect.

Apparently, it will be understood that the invention is not limited to the embodiments disclosed, but is capable of all embodiments without departing from the spirit of the invention.

What is claimed is:

1. An LED epitaxial structure, comprising:
   a growth substrate;
   an n-type gradient buffer layer over the growth substrate;
   an n-type semiconductor layer over the n-type gradient buffer layer;
   an active layer over the n-type semiconductor layer; and
   a p-type semiconductor layer over the active layer;
   wherein an n-type doping of the n-type gradient buffer layer has a Gaussian distribution, and a side of the n-type gradient buffer layer adjacent to the growth substrate is highly doped.

2. The LED epitaxial structure of claim 1, wherein an n-type doping concentration of the n-type gradient buffer layer is more than $1\times10^{18}$.

3. The method of claim 1, wherein the n-type doping of the n-type gradient buffer layer has a Gaussian distribution, and a side of the n-type gradient buffer layer adjacent to the growth substrate is highly doped.

4. A method for LED epitaxial growth, comprising:
   1) providing a growth substrate, on which a u-doped buffer layer is formed via a first epitaxial growth;
   2) transforming the buffer layer into an n-type gradient buffer layer through ion implantation;
   3) forming an n-type semiconductor layer via a second epitaxial growth on the n-type gradient buffer layer;
   4) forming an active layer on the n-type semiconductor layer via epitaxial growth; and
   5) forming a p-type semiconductor layer on the active layer via epitaxial growth.

5. A vertical LED chip structure, comprising:
   a conductive substrate;
   a light-emitting epitaxial layer on the conductive substrate including an n-type semiconductor layer, a p-type semiconductor layer and an active layer between the two;
   an n-type gradient buffer layer formed on the n-type semiconductor layer; and
   an n-electrode formed on the n-type gradient buffer layer;
   wherein an n-type doping of the n-type gradient buffer layer has a Gaussian distribution, and a side of the n-type gradient buffer layer adjacent to the n-type semiconductor layer is highly doped.

6. The vertical LED chip structure as claimed in claim 5, wherein an n-type doping concentration of the n-type gradient buffer layer is more than $1\times10^{18}$ and ranges from $1\times10^{18}$ to $1\times10^{20}$.

7. The vertical LED chip structure of claim 5, wherein a doping concentration of the highly-doped side is $1\times10^{18}\sim5\times10^{18}$.

8. The vertical LED chip structure of claim 5, wherein a side of the n-type gradient buffer layer away from the n-type semiconductor layer is highly doped with a doping concentration of $5\times10^{18}\sim1\times10^{20}$.

9. The vertical LED chip structure of claim 5, wherein the n-type gradient buffer layer has a flat surface or a patterned concave-convex surface.

10. A method for making the vertical LED of claim 5, comprising:
    1) providing a growth substrate, on which a u-doped buffer layer is formed via a first epitaxial growth;
    2) transforming the buffer layer into an n-type gradient buffer layer through ion implantation;
    3) forming an n-type semiconductor layer, an active layer and a p-type semiconductor layer via a second epitaxial growth on the n-type gradient buffer layer to thereby form an LED epitaxial structure;
    4) forming a metal reflecting layer on the p-type semiconductor layer;
    5) bonding a conductive substrate with the epitaxial structure;
    6) removing the growth substrate and exposing a surface of the n-type gradient buffer layer;
    7) making an n-electrode on the exposed n-type gradient buffer layer; and making a p-electrode on a back of the conductive substrate; and 8)
    forming a vertical LED chip by cutting.

11. The method of claim 10, wherein the n-type doping concentration of the n-type gradient buffer layer is more than $1\times10^{18}$ and ranges from $1\times10^{18}$ to $1\times10^{20}$.

12. The method of claim 10, wherein the n-type doping of the n-type gradient buffer layer has a Gaussian distribution, and a side adjacent to the n-type semiconductor layer has a low doping.

13. The method of claim 10, wherein in step 2), an n-type gradient buffer layer is formed by injecting Si ion in the buffer layer.

* * * * *